United States Patent
Sonego et al.

(10) Patent No.: US 6,472,750 B1
(45) Date of Patent: Oct. 29, 2002

(54) PROCESS FOR REALIZING AN INTERMEDIATE DIELECTRIC LAYER FOR ENHANCING THE PLANARITY IN SEMICONDUCTOR ELECTRONIC DEVICES

(75) Inventors: Patrizia Sonego, Milan; Maurizio Bacchetta, Cologno Monzese (Milan), both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 15 days.

(21) Appl. No.: 09/645,711

(22) Filed: Aug. 24, 2000

Related U.S. Application Data

(62) Division of application No. 08/987,454, filed on Dec. 9, 1997.

(30) Foreign Application Priority Data

Dec. 24, 1996 (EP) .............................. 96830646

(51) Int. Cl.[7] .............................................. H01L 23/48
(52) U.S. Cl. ....................................... 257/758; 257/758
(58) Field of Search ................................. 257/758, 750

(56) References Cited

U.S. PATENT DOCUMENTS

| | | | |
|---|---|---|---|
| 4,952,524 A | 8/1990 | Lee et al. | |
| 5,994,762 A | * 11/1999 | Suwanai et al. | ............ 257/620 |
| 6,034,419 A | * 3/2000 | Nicholls et al. | ............ 257/641 |
| 6,150,692 A | * 11/2000 | Iwanaga et al. | ............ 257/315 |

FOREIGN PATENT DOCUMENTS

| | | | |
|---|---|---|---|
| EP | 89112712.8 | 7/1989 | ......... H01L/23/485 |
| EP | 93301479.7 | 2/1993 | ......... H01L/21/316 |
| EP | 94830167.6 | 4/1994 | ....... H01L/21/3105 |

OTHER PUBLICATIONS

Ruska, Walter E. W., Microelectronic Processing 1987, McGraw–Hill, I, 278–279.*
Yasuo Uoochi, et al., "Spin–on Glass Curing by Rapid Thermal Annealing," *Journal of the Electrochemical Society*, vol. 137, No. 12, Dec. 1990, pp. 3923–3925.

* cited by examiner

*Primary Examiner*—David L. Talbott
*Assistant Examiner*—Lourdes Cruz
(74) *Attorney, Agent, or Firm*—Lisa K. Jorgenson; Allen, Dyer, Doppelt, Milbrath & Gilchrist, P.A.

(57) ABSTRACT

A method is for forming an intermediate dielectric layer to optimize the planarity of electronic devices integrated on a semiconductor which incorporate non-volatile memories. The insulating dielectric is deposited from a liquid state source comprising silicon oxides and organics of the resist type. The liquid dielectric layer is evenly spread by a spinning technique providing good levels of planarity. Solidification, referred to as polymerization, is achieved through a low-temperature thermal cycle. Since this dielectric layer cannot be used as such to isolate the semiconductor substrate from the overlying metallization plane on account of the presence of organics forming a source of impurities, it is arranged for the layer to be encapsulated between two dielectric layers of silicon oxide as deposited from a plasma. To make the highly planarizing intermediate dielectric layer consistent with the other two encapsulating dielectric layers, a rapid annealing step is carried out in an oven under a gas stream, subsequently to the polymerization step. The rapid annealing step is also utilized to densify the upper dielectric layer encapsulating the highly planarizing intermediate dielectric layer.

13 Claims, 5 Drawing Sheets

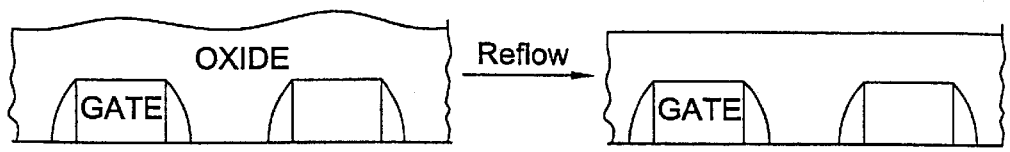
FIG. 1A.
(PRIOR ART)
FIG. 1B.
(PRIOR ART)
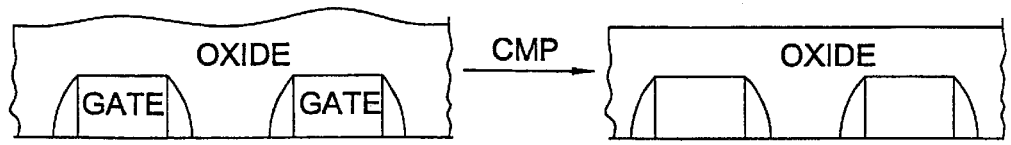
FIG. 2A.
(PRIOR ART)
FIG. 2B.
(PRIOR ART)
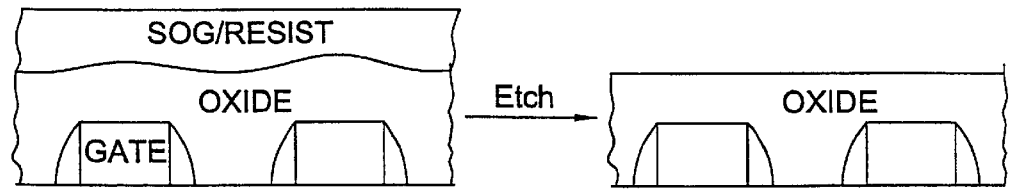
FIG. 3A.
(PRIOR ART)
FIG. 3B.
(PRIOR ART)
FIG. 4A.
(PRIOR ART)
FIG. 4B.
(PRIOR ART)
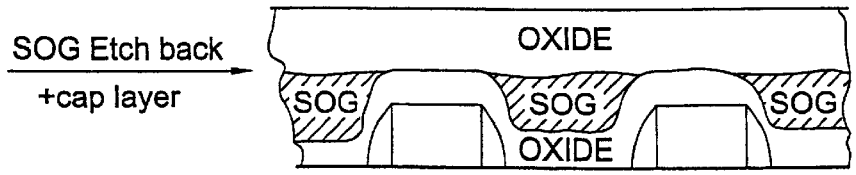
FIG. 4C.
(PRIOR ART)

PROCESS FOR REALIZING AN INTERMEDIATE DIELECTRIC LAYER FOR ENHANCING THE PLANARITY IN SEMICONDUCTOR ELECTRONIC DEVICES

This application is a division of Ser. No. 08/987,454, filed Dec. 9, 1997.

FIELD OF THE INVENTION

This invention relates to semiconductor manufacturing, and, more particularly, relates to a method of forming an intermediate dielectric layer to optimize the planarity of electronic devices integrated on a semiconductor with CMOS technology and which includes a plurality of MOS transistors having gate regions being formed on a semiconductor substrate.

BACKGROUND OF THE INVENTION

As is well known, to increase the capacity for the integration of semiconductor electronic devices, the resolution of their topographic geometries must be improved so as to minimize the size of the individual devices. This can only be achieved if the planarity of the semiconductor surfaces to which the circuit topography is transferred, as by conventional photolithographic and wet or dry etching techniques, can be improved. In particular, for electronic circuits integrated on semiconductors and incorporating non-volatile memories, this requirement must allow for certain specific constraints.

A first constraint is represented, for example, by the ability to provide insulating dielectric layers with enhanced planarity. Dielectric layers serve to isolate a semiconductor substrate region, wherein MOS components have been formed with their polysilicon gate regions, from an overlying metallization plane. The planarity of the insulating dielectric layer does affect the resolution of planar electric connection patterns on the overlying metallization plane.

Another constraint imposed by the memory circuits is the need for low-temperature fabrication processes, because integrated electronic devices which incorporate non-volatile memories have shallow junctions and metal contacts which are sensitive to high temperatures, especially in the gate regions. High temperatures are responsible for the diffusion phenomenon whereby the dopant chemical species are allowed to migrate into the semiconductor and may render the device inoperative. It should be mentioned, moreover, that the dielectric layer isolating the metallization plane from the substrate underneath is bound to contain dopant species of the N type at high concentrations in virtually all cases.

In fact, non-volatile memories require that an N-doped insulating dielectric layer be provided to promote electric charge retention in the gate regions associated with the memory cells by the well-known mechanism of gettering the movable metal ions into a dielectric including the N dopant. A first known approach to meeting this requirement for optimized planarity within the above constraints is shown in FIGS. 1A and 1B, and provides for the deposition of an insulating dielectric layer of the BPSG type between the semiconductor substrate and the overlying metallization plane using a PECVD technique from a gaseous or a solid source. Planarization is then completed by a thermal treatment in an oven at temperatures close to the melting temperature of the deposited dielectric layer.

This prior approach has the serious drawback that there is the need of using dielectrics with high Phosphorous concentrations, but low Boron concentrations which allow obtaining satisfactory planarization levels only by high temperatures thermal treatments, such as, in the range of 750°–850° C. Such thermal treatments are not compatible with the memory devices considered herein, since these dielectric films degrade at temperatures above 850° C.

A second prior approach is shown schematically in FIGS. 2A and 2B which provides for the deposition of dielectric layers formed from non-planarized USG, PSG, and BPSG oxides and being of substantial thickness. Planarization is then achieved by a chemiophysical attack known by the acronym CMP (Chemical Mechanical Polishing). While achieving its objective, not even this approach is devoid of shortcomings inherent to the chemiophysical attacks, such as, the difficultly of control and the high sensitivity to the concentrations of dopants in the dielectric layer.

A third approach, resembling the second approach above, is illustrated in FIGS. 3A and 3B and provides for the deposition of a first, non-planarized dielectric layer having a USG, PSG, BPSG type of oxide with substantial thickness, over which a gel is then deposited using a spinning technique, e.g. a SOG (Spin-On-Glass) which has high viscosity and planarizing properties and allows a second dielectric layer to be formed. Alternatively, a resist could be used. This second dielectric layer is solidified during a subsequent step by a densifying and branching operation, loosely referred to as "polymerization" hereinafter with no limitative implications.

Solidification is illustratively effected at a temperature of 400° C. The planarization of the ultimate dielectric layer is achieved by a plasma or an aqueous solution etching process to thoroughly remove the planarizing dielectric layer of the SOG type, or the resist, and, in part, the first dielectric layer as well.

The drawbacks of this third approach originate from the use of techniques of the etch-back type without masking which are difficult to control because of the different values of the etch rates associated with the two dielectric layers deposited. This degrades the planarity previously provided by the second dielectric layer of the SOG type.

A fourth approach provides, as shown in FIGS. 4A and 4B, for the formation of a multi-layered dielectric structure which fully covers the semiconductor substrate and comprises: a first insulating dielectric layer, e.g. of silicon oxide; a second, intermediate planarizing dielectric layer, e.g. of SOG; and a third, capping and encapsulating dielectric layer, e.g. of PSG or BPSG. The first dielectric layer is undoped and is deposited by CVD techniques to a predetermined thickness, for the sole purpose of isolating the semiconductor substrate from the subsequent deposition of the intermediate dielectric layer.

The second planarizing layer is formed by depositing, from a liquid source, a material of the SOG type containing silicates and no organic radicals. Such silicates may be lightly doped with phosphorus. These materials are evenly spread over the first dielectric layer by a "spinning" technique, and then solidified by thermal treatments which result in the materials polymerizing at low temperatures, barely higher than 400° C. After that, these materials are stabilized by a thermal treatment with temperatures higher than 700° C. To seal this intermediate dielectric layer, as a potential cause for diffusion of impurities into the substrate, a third dielectric layer, typically of silicon oxide, is deposited by chemical vapor deposition techniques (PECVD, APCVD, SACVD, etc.). This third layer must be doped with impurities of either the N or Phosphorous type to meet the requirements for charge retention to the memory cells integrated on the semiconductor substrate (gettering of movable metal impurities).

A detailed description of this deposition method and the formation of this layered dielectric structure is given in an article entitled INTERLEVEL DIELECTRIC PLANARIZATION WITH SPIN-ON GLASS FILMS by Landon B. Vines of Thomson Components-Mostek Corporation and Satish K. Gupta of Allied Signal Corporation. While being advantageous in many ways, this fourth approach also has a serious drawback in that it uses a silicate SOG for the planarizing intermediate dielectric layer. This type of SOG provides low planarity, due to the small thickness that must be maintained for the spinning step. For this reason, a number of spinning operations (i.e. several steps of even distribution of the solution over the surface) must be performed, each interleaved with thermal treatments, to obtain acceptable levels of planarity. This decreases the repeatability and makes the method difficult to control.

Repeated thermal treatments at temperatures higher than 500° C. may result in contaminants being released which will migrate to the substrate. Another disadvantage brought about by the intermediate dielectric layer of the SOG type is the proneness of this material to cracking at its thickest spots. Large thickness dimensions are desirable from the standpoint of planarity, but are more likely to crack.

For a review of further problems tied to intermediate dielectric layers, reference can be had to an article entitled A SCALABLE MULTILEVEL METALLIZATION WITH PILLAR INTERCONNECTIONS AND INTERLEVEL DIELECTRIC PLANARIZATION by Egil D. Castell, Vivek D. Kulkarni, Paul E. Riley of National Semiconductor Corporation which describes, on page 610, a process for forming an intermediate dielectric layer from a liquid source using an LPCVD technique and a resist type of material to planarize the surface of the dielectric grown. In this case, a single dielectric layer is deposited by two successive depositions of silicon oxide using an LPCVD technique, between which a high-temperature thermal treatment and plasma etching using $A_r/CF_4/O_2$ are applied.

SUMMARY OF THE INVENTION

In view of the foregoing background, it is therefore an object of this invention to provide a method of forming an insulating dielectric so as to optimize the planarity of semiconductor integrated electronic devices incorporating non-volatile memories and for which a highly planarized intermediate dielectric layer can be consistent with the layers of the multi-layered structure, thereby overcoming the limitations of the prior art.

The technical problem has been solved by a method of making a multi-layered dielectric structure having an intermediate dielectric layer which is formed from a siloxane SOG (SiOx(R)Y) having high planarizing properties, as deposited from a liquid source and then solidified by a polymerization process. This second intermediate layer of insulating dielectric is subjected, after the solidification step, to a rapid thermal annealing cycle, or to slower annealing in an oven in an oxygen environment, to have the siloxane converted to a silicon oxide. In this way, the requirement for a highly planarizing intermediate dielectric layer and that for an intermediate layer doped with N-type impurities have been accommodated without resorting to any plural depositing and spinning steps interleaved with solidifying thermal cycles, which would otherwise result in loss of planarity and low process repeatability.

Advantageously, this method yields improved planarization with a single depositing and spinning step. By using siloxane, high planarity can be achieved with a single spinning step. The siloxane is then converted into a silicon oxide by a single rapid thermal treatment of the RTA type, or alternatively, by a low-temperature thermal treatment in an oxygen environment which is consistent with the shallow junctions provided in semiconductor integrated devices.

Specifically, the method of this invention includes the step of depositing a third dielectric layer, e.g. of BPSG, to encapsulate the highly planarizing intermediate dielectric layer. The third layer is of the BPSG type and subjected, following the deposition step, to a low-temperature thermal treatment appropriate to produce densification.

A possible modification of the deposition method according to the invention provides, after the step of solidifying the second intermediate dielectric layer, for a partial etching step to reduce the thickness of the intermediate layer, so that the plurality of gate regions will be only insulated above by a single dielectric layer. In this way, the presence of the intermediate dielectric layer can be restricted to just the spaces between the gate regions, thereby lowering the likelihood of cracking the intermediate layer, for a given planarity.

BRIEF DESCRIPTION OF THE DRAWINGS

The features and advantages of the deposition method according to the invention will be apparent from the following description of an embodiment thereof, given by way of illustration and not of limitation with reference to the accompanying drawings.

FIGS. 1A and 1B show schematically, to an enlarged scale, a vertical cross-section through a semiconductor electronic device during the making of a planarized dielectric layer by a thermal reflowing step, according to the prior art.

FIGS. 2A and 2B show schematically, to an enlarged scale, a vertical cross-section through a semiconductor electronic device during the making of a planarized dielectric layer by a surface polishing step of the chemical-physical-mechanical type (CMP), according to the prior art.

FIGS. 3A and 3B show schematically, to an enlarged scale, a vertical cross-section through a semiconductor electronic device during the making of a planarized dielectric layer from an oxide-SOG plane structure, according to the prior art.

FIGS. 4A to 4C show schematically, to an enlarged scale, a vertical cross-section through a semiconductor electronic device during the several steps of depositing a multi-layered dielectric structure of the oxide-SOG-oxide type, according to the prior art.

DETAILED DESCRIPTION OF THE PREFERRED EMBODIMENTS

Figure 5A:
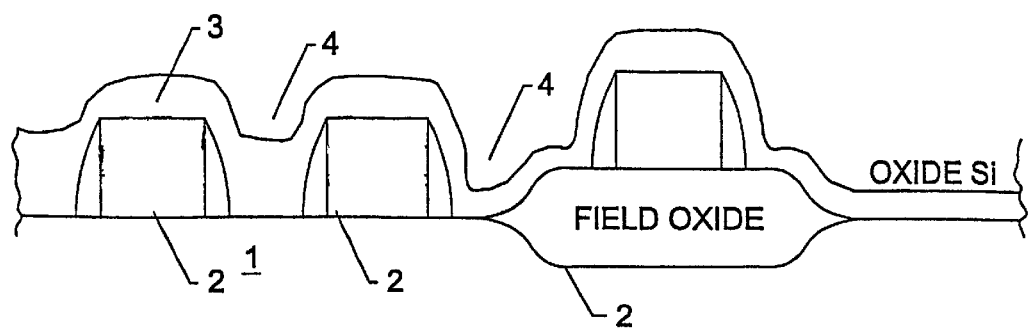
FIGS. 5A to 5C show schematically, to an enlarged scale, a vertical cross-section through a semiconductor electronic device during the several steps of depositing a multi-layered dielectric structure of the oxide-SOG-BPSG type, in accordance with the principles of this invention.
Figure 5B:
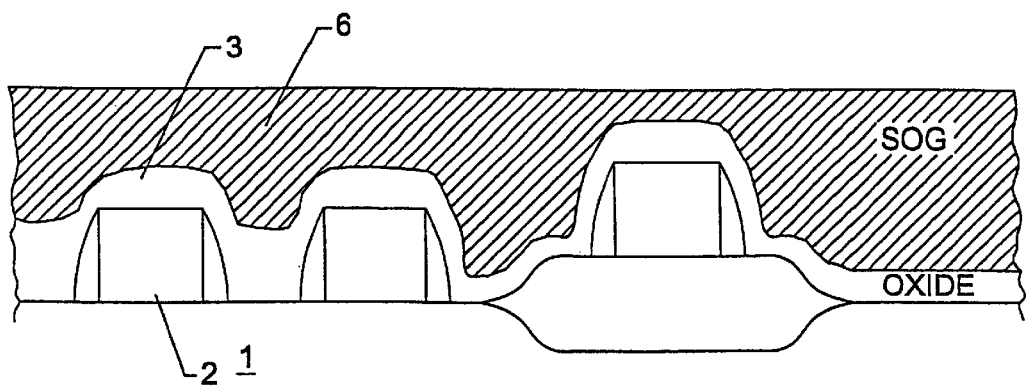
Figure 5C:
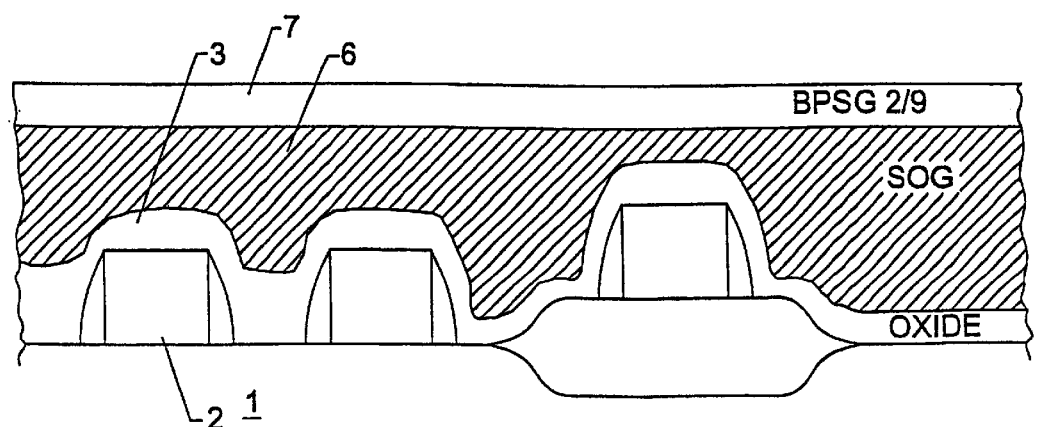

With reference to the drawing FIGURES, and specifically to the example of FIGS. 5A to 5C illustrating schematically, to an enlarged scale, a vertical cross-section of a semiconductor electronic device through the several steps of depositing a planarizing multi-layered dielectric structure, a deposition method in accordance with the principles of this invention will now be described. The method of this invention includes the same processing steps as those described in relation to FIGS. 4A and 4B, with certain characteristic differences affecting the deposition of the individual dielectric layers. The resulting insulating structure especially suits semiconductor substrates integrating electronic devices of the MOS type, such as non-volatile memories of the EPROM or FLASH types, since the limitations of the prior art can be overcome thereby.

FIG. 5 shows a semiconductor substrate 1 whereon electronic devices, such as MOS transistors having respective gate regions 2, are integrated. The devices may be floating-gate non-volatile memory cells, which are fully covered with a first insulating dielectric layer 3. The first layer 3 is a layer of undoped silicon oxide, as deposited at a low temperature using a PECVD (Plasma-Enhanced Chemical Vapor Deposition) technique, which is 500 to 3,000 Å thick, that is adequate to provide a protective barrier against external contamination for the gate regions 2 and the doped active areas of the substrate.

As shown in FIG. 5B, dielectric is deposited over the first layer from a liquid phase using a spinning technique at a speed in the 1,000 to 4,000 rpm range, until the voids 4 between gate regions 2 are filled. The liquid sol-gel material used for this operation is a siloxane SOG (Spin-On Glass), and comprises silicon oxide with saturated and unsaturated organic radicals. The thickness provided with this operation is illustratively within the range of 3,000 to 10,000 Å, and is obtained by a single spinning step. A polymerization process, carried out at a temperature in the 400° C. range, for example, allows the SOG material to be solidified into a second, highly planarized intermediate dielectric layer 6.

The material from which the second dielectric layer is formed has a drawback in that it is not consistent with the device due to the presence of organic compounds. Accordingly, the SOG must be converted prior to depositing a further covering layer. Otherwise, in densifying the upper BPSG layer at about 700° C. the SOG would crack and might release organics, thereby releasing contaminants of the kind of C, H, $H_2O$, CO, $OH^-$, which are liable to degrade the electrical characteristics of each electric device integrated on the semiconductor substrate.

To stabilize the material present in the second dielectric layer 6 and make it consistent with the processing conditions, the invention advantageously includes, subsequent to the solidifying step, a rapid thermal annealing process, or alternatively a slower annealing process in an oven. This treatment is applied at a temperature illustratively in the 700 to 800° C. range, under an oxygen inflow condition. This allows the organics present in the second dielectric layer 6 to be burned off, and the layer densified, but without altering the characteristics of the substrate and while maintaining its consistency with the high-temperature degradable materials. The result is a conversion of the layer 6 into a silicon oxide $SiO_x(R)_y$. The second dielectric layer thus obtained has the same characteristics as a silicon oxide layer deposited by an LPCVD technique, with an illustrative value of 1.46 for the refractive index.

Figure 10:
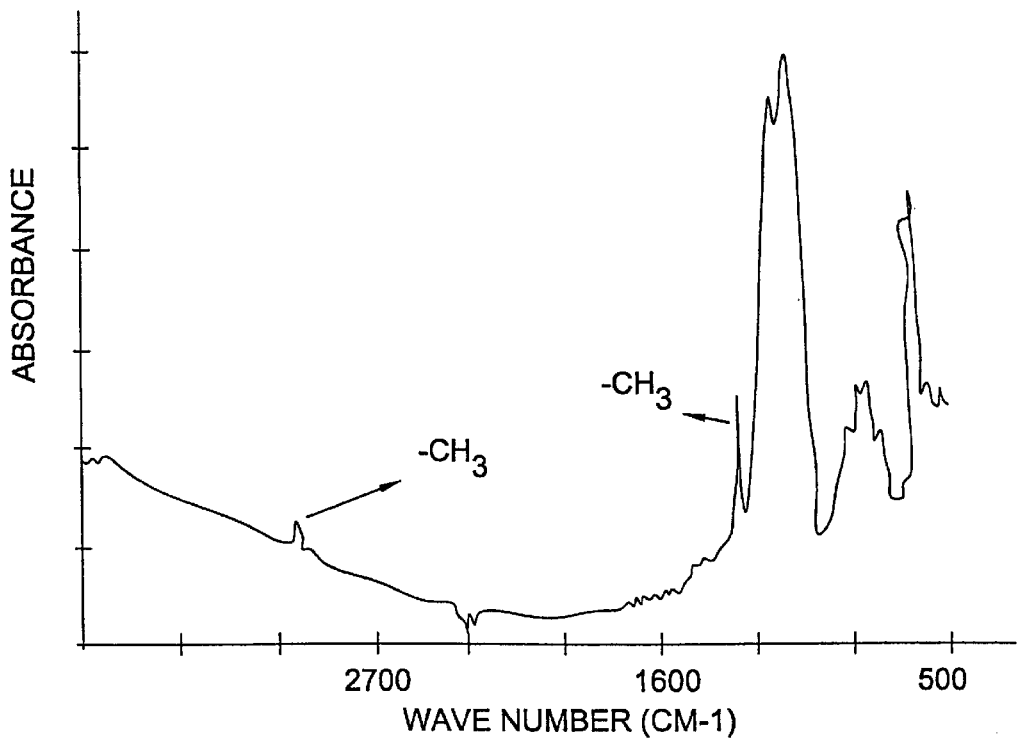
FIG. 10 is a spectral diagram of a SOG dielectric layer prior to subjecting it to a rapid thermal annealing process, as provided by this invention.
Figure 11:
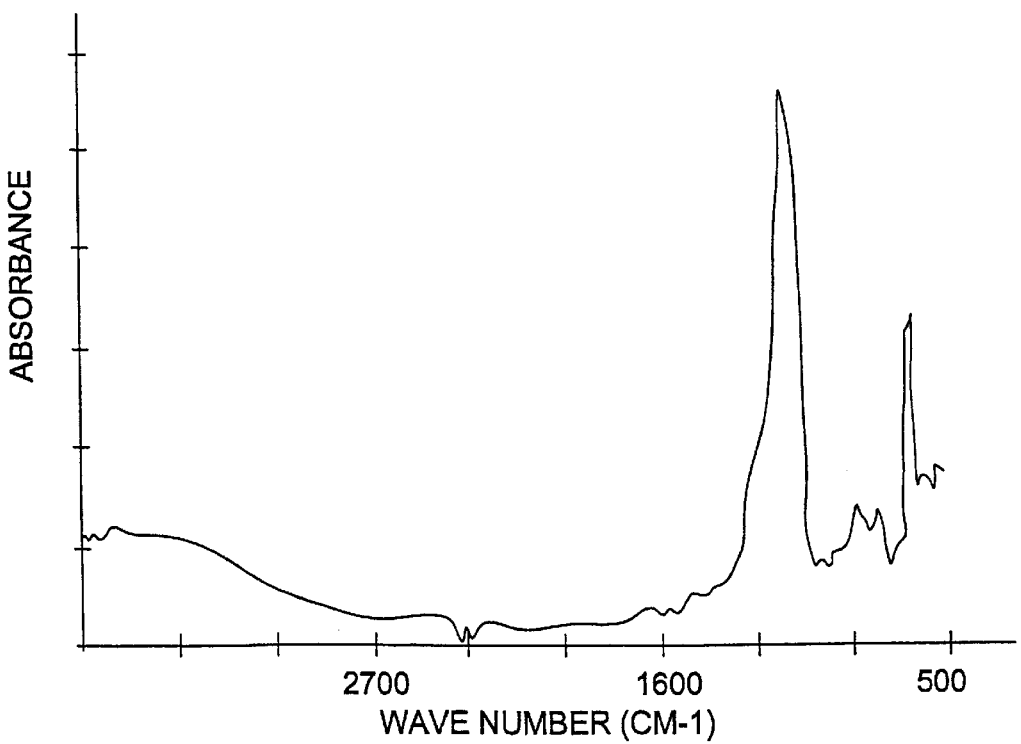
FIG. 11 is a spectral diagram of a SOG dielectric layer after it has been subjected to a rapid thermal annealing process, as provided by this invention.

To verify the absence of organics from the second dielectric layer 6 after the rapid thermal annealing process, the two graphs shown in FIGS. 10 and 11, which illustrate an infrared absorption spectrum associated with the second dielectric layer beforehand after the thermal treatment, respectively, should be compared with each other. It can be seen that the two absorption peaks centered about the wavelengths 1300 $[cm^{-1}]$ and 2900 $[cm^{-1}]$, and indicating presence of the $CH_3$ organic radical in the dielectric layer under consideration, are absent from the graph of FIG. 11, while being evident in the graph of FIG. 10.

Further to forming the first 3 and second 6 dielectric layers, the method of this invention comprises a subsequent deposition of a third dielectric layer 7. This layer 7 thickness is illustratively within the range of 3,000 to 7,000 Å, as shown in FIG. 5C, and is obtained by a CVD (PECVD, LPCVD, SACVD, APCVD) technique from a liquid or a gaseous source. The object of this is to provide a dielectric layer 7 of either the BPSG or the PSG type having a high concentration of phosphorus. Specifically where the multi-layered dielectric structure obtained with the inventive method is used to insulate electronic devices which incorporate non-volatile memories, a phosphorus concentration above 7% is necessary to meet the requirement for floating gate charge retention.

To further optimize the planarity of the multi-layered dielectric structure, a film densification and stabilization step is carried out on the third dielectric layer by means of a rapid thermal annealing process. Alternatively, slower annealing may be applied in an oven under a gas stream, such as an oxygen or nitrogen stream, at a temperature illustratively within the range of 600 to 900° C.

The method of depositing the multi-layered dielectric structure described above allows for modifications whose potential objective is to ensure improved results from the deposition method of this invention. In particular, an etching step, using a plasma or an aqueous solution containing hydrofluoric acid (HF), may be additionally provided subsequent to polymerizing the second intermediate dielectric layer 6; that is, prior to the rapid thermal annealing of the second dielectric layer 6. With this etching, the presence of the SOG material which makes up the second intermediate dielectric layer will be restricted to the areas included between gate regions 4, as shown in FIG. 6.

Figure 6:
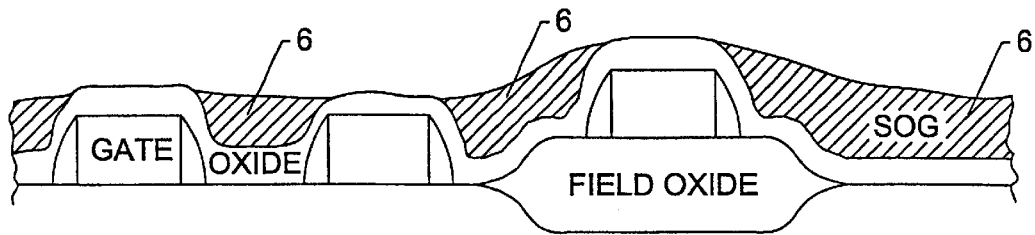
FIG. 6 shows schematically, to an enlarged scale, a vertical cross-section through a semiconductor electronic device during the step of depositing an intermediate dielectric layer, in a possible modification of the deposition method according to the invention.

FIG. 6 is to be regarded as alternative to the example in FIG. 5B in accordance with the instant modified embodiment of the inventive deposition method. The added advantages thus obtained proceed from the possibility of achieving, for a given overall planarity of the dielectric structure, a thinner intermediate dielectric layer, effective to attenuate the problems connected with the metallization required to form metal contacts for gates and active areas, as well as the cracking risk during the rapid thermal annealing process.

Figure 7:
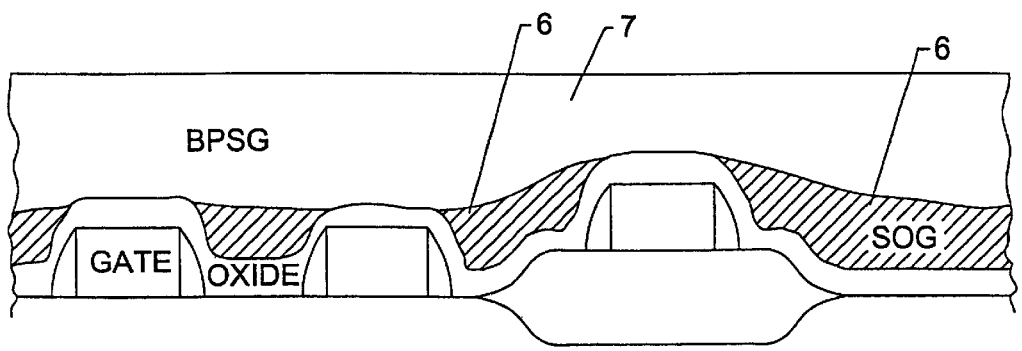
FIG. 7 shows schematically, to an enlarged scale, a vertical cross-section through a semiconductor electronic device during a step of depositing a third, encapsulating dielectric layer, according to another modification of the inventive deposition method.

A further modification of the inventive deposition method provides for the third dielectric layer 7 to have, as shown in FIG. 7, a substantial thickness illustratively within the range of 7,000 to 12,000 Å, so that partial reflowing can be applied for improved planarity. This particular modification provides for the introduction of an additional etching step, using a plasma or an aqueous HF solution, following the rapid thermal annealing step for the third dielectric layer 7, to reduce the BPSG thickness to a desired thickness (about 10,000 Å) for the dielectric stack.

Figure 8:
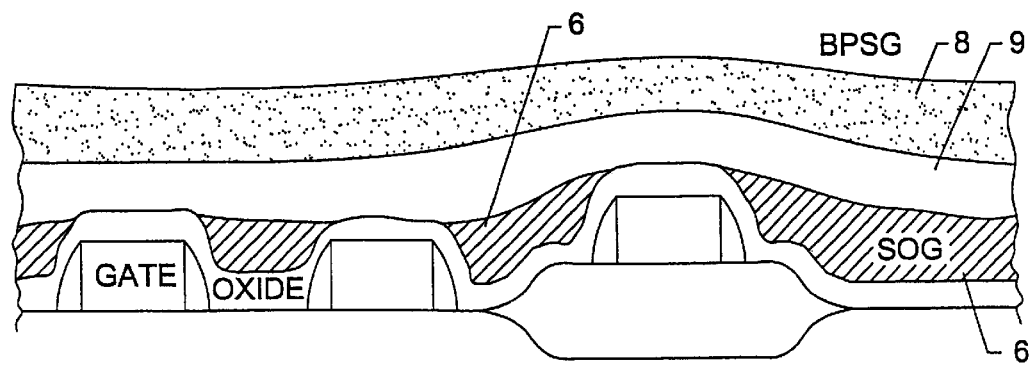
FIG. 8 shows schematically, to an enlarged scale, a vertical cross-section through a semiconductor electronic device during a step of depositing a third dielectric layer made up of two layer portions each having respective concentrations of phosphorus and boron, according to another encapsulating modification of the inventive deposition method.

It may also be arranged, as shown in FIG. 8, for the third dielectric layer 7 of the BPSG type to include: a first layer deposited over the second intermediate dielectric layer and having a high phosphorus concentration, in a proportion illustratively within the range of 6 to 10% (6%<P<10%), and a boron concentration within the range of 1 to 3% percent (1%<B<3%); and a second layer deposited over the first and having a high boron concentration, illustratively within the range of 4 to 6% percent (4%<B<6%), and a phosphorus concentration within the range of 3 to 5% (3%<P<5%).

This particular configuration of the third dielectric layer can meet a first design requirement for charge retention to the gate regions associated with non-volatile memory cells, as well as a second requirement for good planarity of the multiple plane dielectric structure, to be obtained with lower-temperature methods than in the prior art. The first design requirement is satisfied by the first sub-layer 9 having a high phosphorus concentration, and the second requirement is satisfied by the sub-layer 8 having a high boron concentration, which admits of a lower melting temperature for the third dielectric layer 7, and accordingly, of lower-temperature reflowing.

To summarize, this method of depositing the intermediate dielectric layer 6, as applied in accordance with the principles of this invention, provides excellent planarity of the multiple plane dielectric structure using low-temperature thermal processes which are consistent with integrated electronic devices containing degradable materials at high temperatures and/or including shallow junctions which are highly susceptible to thermal diffusion phenomena.

Also, unlike other deposition methods which utilize a SOG-type dielectric as the intermediate layer of a multi-layered dielectric structure, good planarity can be achieved with a single spinning and polymerization operation, even where the phosphorus concentration in the intermediate layer needs to be high. Consequently, the boron concentration should be low to remain inside the film stability region. Furthermore, it should be noted that the rapid thermal annealing process following the intermediate dielectric layer 6 polymerization step would change the layer composition, and limit the organic impurities source. As for the processes of reflowing the third encapsulating dielectric layer 7, it should be noted that the thermal cycles provided occur at lower temperatures, for the same planarity.

Figure 9:
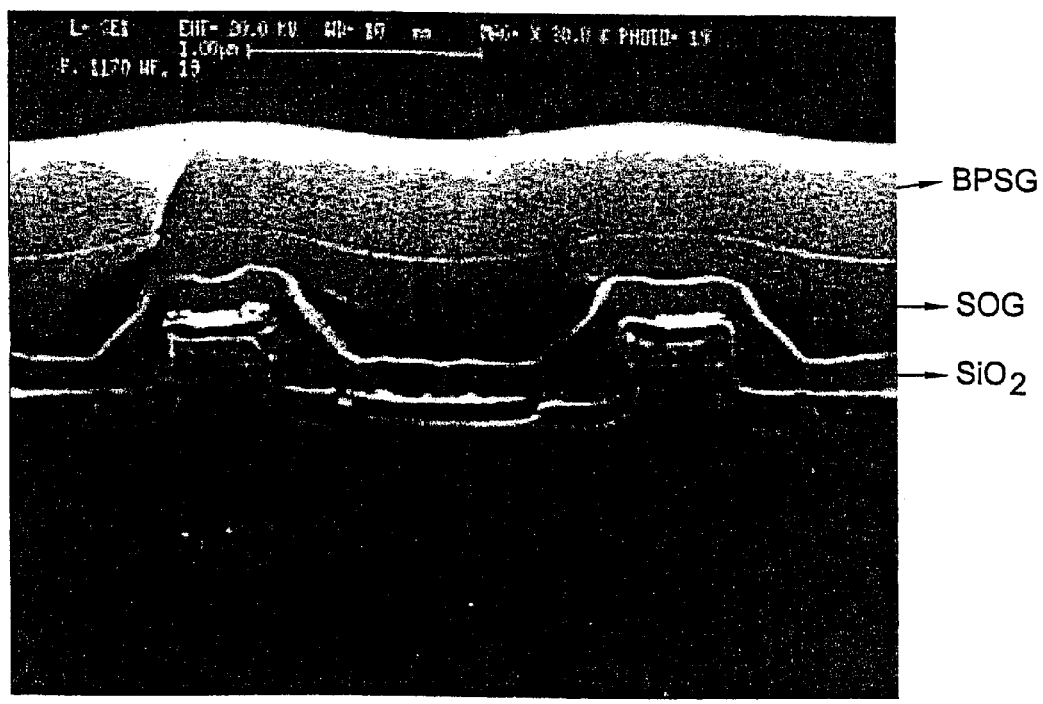
FIG. 9 is a photograph taken at the electronic microscope of the multi-layered dielectric structure as formed with the inventive deposition method.

All of the above advantages associated with the deposition method of this invention can be readily recognized and ascertained by electronic microscope TEM and SEM analyses (see FIG. 9), when carried out on semiconductor substrates having multi-layered insulating dielectric structures grown thereon with the foregoing inventive method.

That which is claimed:

1. An integrated circuit comprising:
    a substrate and a plurality of electronic devices thereon, said electronic devices comprising gate regions;
    an intermediate dielectric structure comprising
        a first dielectric layer to cover said plurality of gate regions and voids therebetween,
        a second intermediate dielectric layer distributed over said first insulating dielectric, and
        a third dielectric layer covering said second intermediate dielectric layer, said third dielectric layer comprising a first partial-layer having a high phosphorus concentration, and a second partial-layer having a high boron concentration on the first partial-layer.

2. An integrated circuit according to claim 1, wherein said third dielectric layer comprises BPSG.

3. An integrated circuit according to claim 2, wherein said third dielectric layer comprises BPSG and includes phosphorus in excess of about 7%.

4. An integrated circuit according to claim 1, wherein said third dielectric layer has a thickness in a range of about 3,000 to 7,000 Å.

5. An integrated circuit according to claim 1, wherein said first dielectric layer extends to a level substantially flush with outermost portions of the gate regions.

6. An integrated circuit according to claim 1, wherein the first partial-layer has a phosphorus concentration in a range of about six to ten percent (6%<P<10%) and a boron concentration in a range of about one to three percent (1%<B<3%).

7. An integrated circuit according to claim 1, wherein the second partial-layer has a boron concentration in a range of about four to six percent (4%<B<6%) and a phosphorous concentration in a range of about three to five percent (3%<P<5%).

8. An integrated circuit comprising:
    a substrate and a plurality of electronic devices thereon, said electronic devices comprising gate regions;
    an intermediate dielectric structure comprising
        a first dielectric layer comprising silicon oxide and covering said plurality of gate regions and voids therebetween,
        a second intermediate dielectric layer comprising siloxane SOG and covering said first insulating dielectric, and
        a third dielectric layer comprising BPSG and covering said second intermediate dielectric layer, said third dielectric layer comprising a first partial-layer having a high phosphorus concentration, and a second partial-layer having a high boron concentration on the first partial-layer.

9. An integrated circuit according to claim 8, wherein said third dielectric layer includes phosphorus in excess of about 7%.

10. An integrated circuit according to claim 8, wherein said third dielectric layer has a thickness in a range of about 3,000 to 7,000 Å.

11. An integrated circuit according to claim 8, wherein said first dielectric layer extends to a level substantially flush with outermost portions of the gate regions.

12. An integrated circuit according to claim 8, wherein the first partial-layer has a phosphorus concentration in a range of about six to ten percent (6%<P<10%) and a boron concentration in a range of about one to three percent (1%<B<3%).

13. An integrated circuit according to claim 8, wherein the second partial-layer has a boron concentration in a range of about four to six percent (4%<B<6%) and a phosphorous concentration in a range of about three to five percent (3%<P<5%).

* * * * *